United States Patent [19]

Kasai

[11] Patent Number: 5,581,088
[45] Date of Patent: Dec. 3, 1996

[54] SPECIMEN-HOLDING DEVICE FOR ELECTRON MICROSCOPE

[75] Inventor: Toru Kasai, Tokyo, Japan

[73] Assignee: JEOL Ltd., Tokyo, Japan

[21] Appl. No.: 545,150

[22] Filed: Oct. 19, 1995

[30] Foreign Application Priority Data

Oct. 20, 1994 [JP] Japan .................................. 6-255233

[51] Int. Cl.⁶ .................................................. H01J 37/20
[52] U.S. Cl. .................. 250/440.11; 250/441.11
[58] Field of Search .................. 250/440.11, 441.11, 250/442.11, 311, 310

[56] References Cited

U.S. PATENT DOCUMENTS

| | | |
|---|---|---|
| 4,101,778 | 7/1978 | Von Rauch et al. ............... 250/441.11 |
| 4,405,865 | 9/1983 | Genty et al. ....................... 250/442.11 |

*Primary Examiner*—Jack I. Berman
*Assistant Examiner*—Kiet T. Nguyen
*Attorney, Agent, or Firm*—Webb Ziesenheim Bruening Logsdon Orkin & Hanson, P.C.

[57] ABSTRACT

A simple specimen-holding device for use with an ultra-high resolution transmission electron microscope. The device comprises a cylindrical support member inserted in the specimen chamber of the microscope, a spherical bearing formed on the inner surface of the front end of the support member, a first pipe, a second pipe rotatably mounted inside the first pipe, a third pipe mounted in the second pipe, a specimen-holding rod, bellows between the second and third pipes, an isolation valve mounted between the first pipe and the specimen chamber, and a mechanism for opening and closing the isolation valve, utilizing rotation of the second pipe. The first pipe is swung about the spherical bearing by at least a y-motion drive means and z-motion drive means. The third pipe can be slid by an x-motion drive means. The rod is slidably mounted in the third pipe via an O-ring.

4 Claims, 6 Drawing Sheets

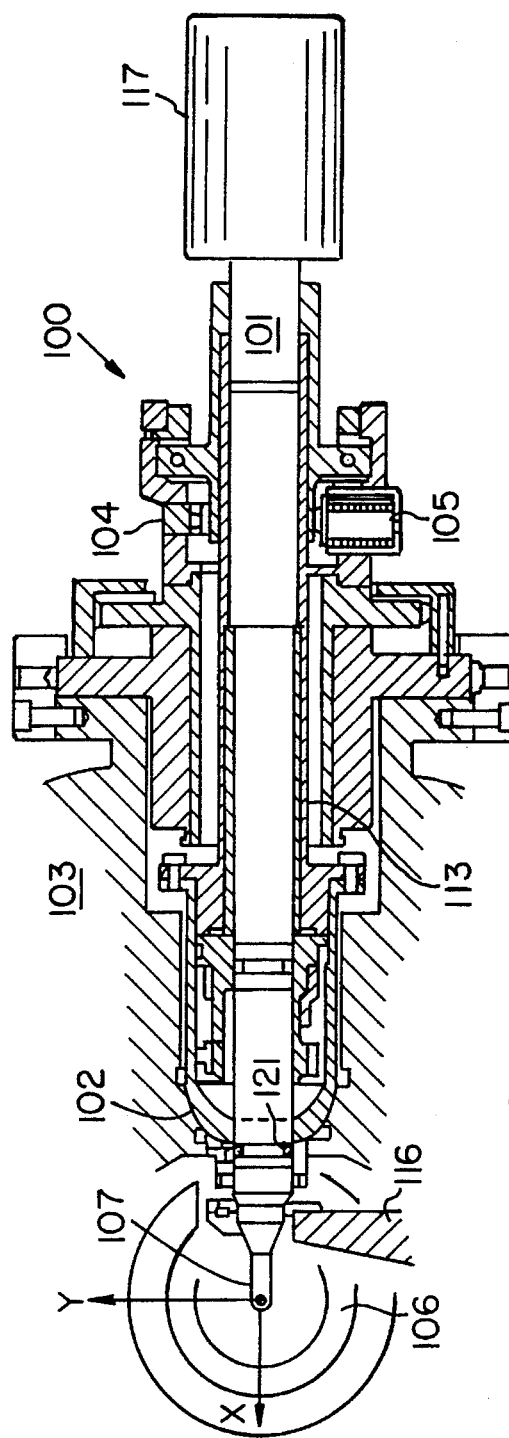
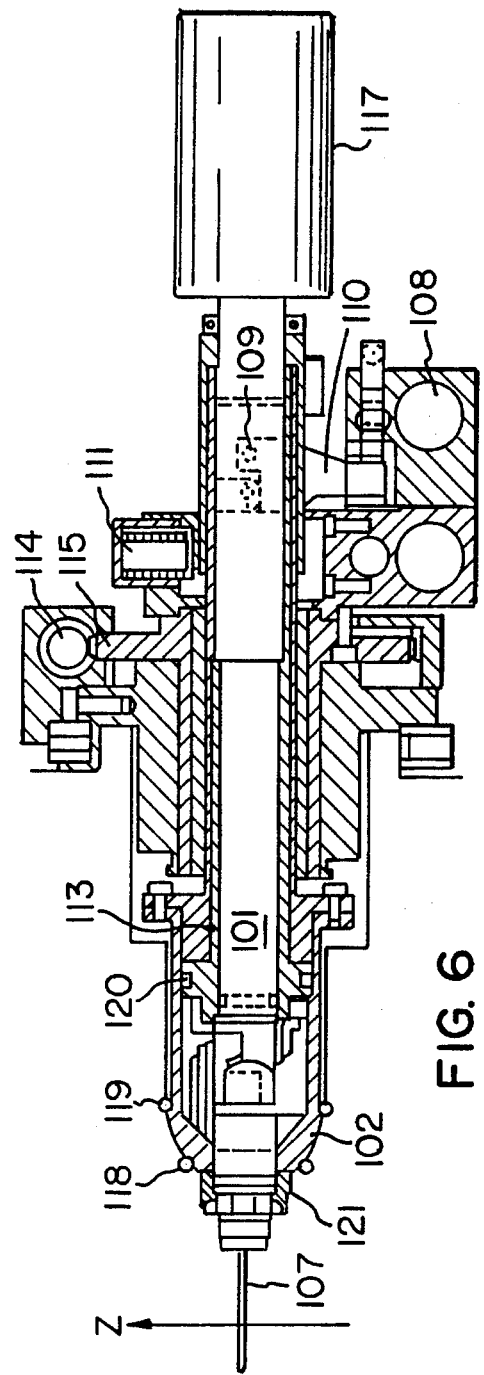
FIG. 5
PRIOR ART
FIG. 6
PRIOR ART

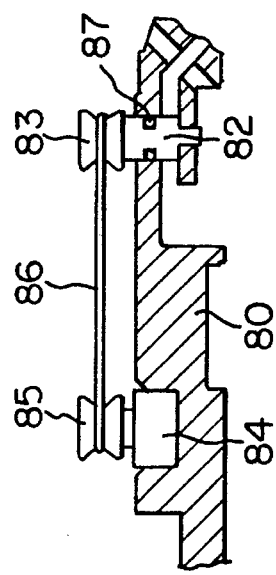
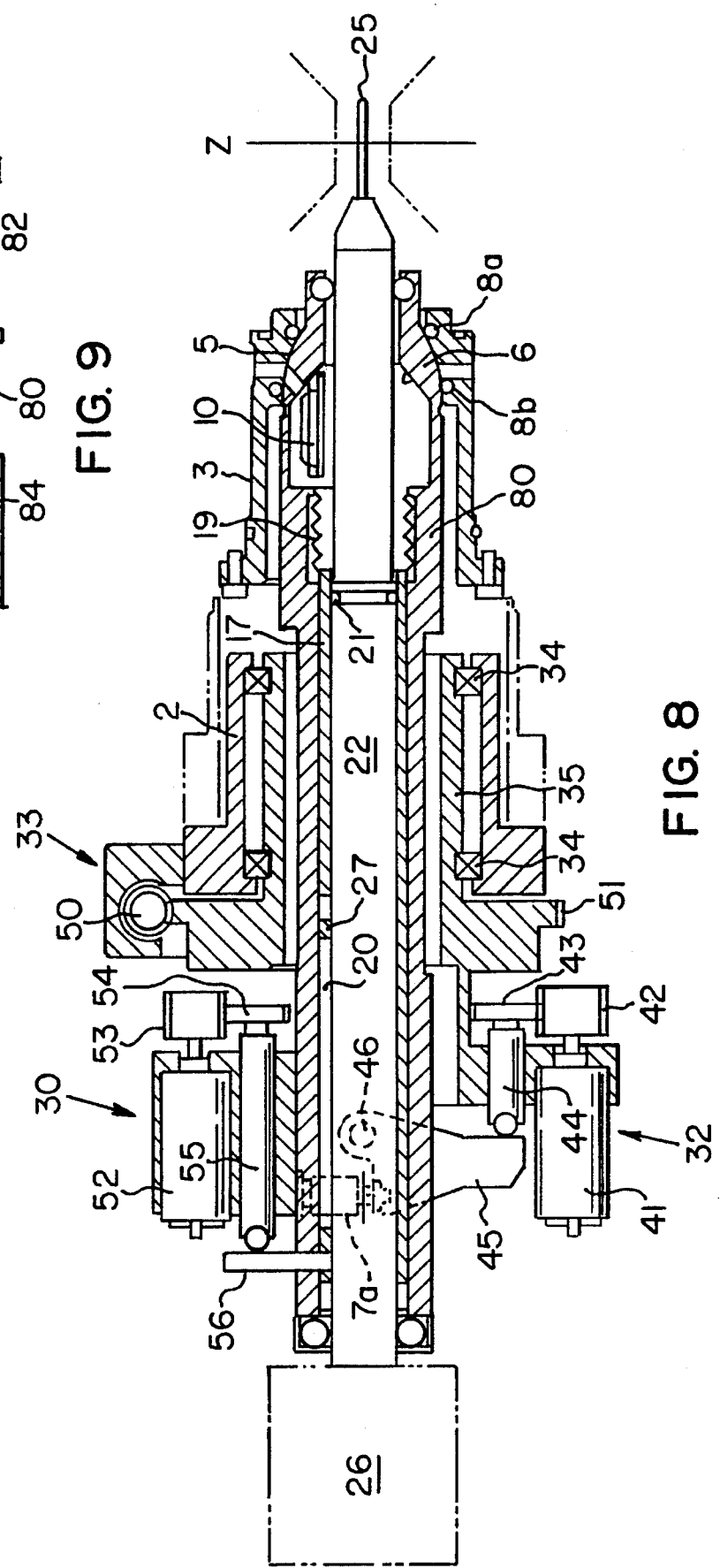

SPECIMEN-HOLDING DEVICE FOR ELECTRON MICROSCOPE

FIELD OF THE INVENTION

The present invention relates to a specimen-holding device for use with an electron microscope.

BACKGROUND OF THE INVENTION

A prior art specimen-holding device for use with an ultra-high resolution transmission electron microscope (TEM) is shown in FIGS. 5 and 6. FIG. 5 is a cross-sectional view taken perpendicular to the optical axis of the electron beam. FIG. 6 is a cross-sectional view taken parallel to the optical axis. It is assumed that the direction of the optical axis of the electron beam lies in the direction of the z-axis. In the plane vertical to the optical axis of the electron beam, the axial direction of the specimen-holding device is taken to lie on the x-axis and the direction perpendicular to the x-axis is taken to lie on the y-axis.

The prior art specimen-holding device, generally indicated by reference numeral 100, has a pipe 113 in which a specimen-holding rod 101 is inserted. Y-motion and z-motion drive units are mounted on the outer surface of the pipe 113. The pipe 113 is totally held to a specimen chamber wall 103 by a spherical bearing 102. The y-motion drive unit incorporates a driving motor (not shown) for shifting a y-motion driving lever 104 (FIG. 5) in the y direction to move the pipe 113 in the y direction against the action of a spring 105. Thus, the specimen-holding rod 101 and a specimen holder 107 inside a specimen chamber 106 are displaced. The holder 107 is connected to the front end of the rod 101. As shown in FIG. 6, the z-motion drive unit has a z-motion driving motor 108 which rotates a z-motion driving lever 110 about a pivot 109. As a result, the pipe 113 is moved in the z direction against the force of a spring 111. These movements in the y and z directions are made via the spherical bearing 102.

Tilt about the x-axis is made by a tilting unit. As shown in FIG. 6, an electric motor (not shown) for tilt about the x-axis rotates a worm gear 114 and a follower gear 115 in mesh with the worm gear 114. This, in turn, rotates the pipe 113. In this way, the specimen-holding rod 101 and the specimen holder 107 can be tilted about the x-axis. Movement in the x direction is made by a driving motor (not shown) via an x-motion driving lever 116 (FIG. 5) which turns about a pivot. In this case, the pressure difference between the vacuum inside the specimen chamber 106 and the outside atmosphere keeps the specimen-holding rod 101 pressed against the lever 116. Under this condition, the x-motion driving lever 116 is moved in the x direction, thus displacing the specimen-holding rod 101 and the specimen holder 107. The inside of the specimen chamber 106 is hermetically isolated from the outside atmosphere by O-rings 118, 119 and 120. Also, the spherical bearing 102 is hermetically isolated from the specimen-holding rod 101 by an O-ring 121.

In electron microscopy, a specimen is required to be placed in position in a short time. At this time, the ranges of movements in the x and y directions are on the order of ±1 mm. The range of movements in the z direction is about 0.5 mm. With the above-described prior art specimen-holding device, movements in the x direction are made by the x-motion driving lever 116. In this case, the spherical bearing 102 is hermetically isolated from the specimen-holding rod 101 by the O-ring 121 on which the rod 101 slides. Therefore, the sliding friction created by the O-ring 121 presents problems. Smooth movements in the x direction are not made. Especially, when the rod begins to move, the speed varies greatly. Also, when the rod is brought to a stop, it is not immediately stopped completely. Consequently, it takes some time until the specimen is settled in a desired position.

Moreover, two mechanisms are provided to shift the specimen. In particular, one mechanism makes movement in the y direction, movement in the z direction, and tilt about the x-axis via the spherical bearing 102. The other mechanism makes movement in the x direction via the x-motion driving lever 116. Hence, the specimen-moving mechanism is made complex. Furthermore, considerable space is needed to install the driving mechanisms. This limits positions at which other components, such as an observational unit and an analytical unit, can be installed.

SUMMARY OF THE INVENTION

The present invention is intended to solve the foregoing problems. It is an object of the invention to provide a specimen-holding device which is for use with an electron microscope and which incorporates an x-motion driving mechanism to thereby simplify the mechanism of the specimen-holding device and to reduce the space necessary for installation. Furthermore, the holding device permits smooth and quick motions in the x direction.

In order to achieve the above object, a specimen-holding device according to the invention is provided for use with an electron microscope having a specimen chamber defined by a wall. The specimen-holding device is characterized in that it comprises a spherical bearing, a first pipe, a second pipe mounted so as to be rotatable inside the first pipe, a third pipe mounted inside the second pipe, a rod for holding a specimen, and bellows mounted between the second pipe and the third pipe. The spherical bearing is inserted in the specimen chamber through its wall and formed on the inner surface of a cylindrical support member. The first pipe is swung about the spherical bearing at least by a y-motion drive means and a z-motion drive means. The third pipe is capable of being slid by an x-motion drive means.

In the present invention, when the rod for holding the specimen moves in the x direction, the O-ring between the third pipe and the rod is stationary. The third pipe is moved while preserving the vacuum seal by the expansion and contraction of the bellows. Therefore, desired x-motion can be smoothly made in a short time. Furthermore, the x-motion drive mechanism is incorporated in the specimen-holding device. This simplifies the structure. Also, the installation space can be reduced.

Other objects and features of the invention will appear in the course of the description thereof, which follows.

BRIEF DESCRIPTION OF THE DRAWINGS

FIG. 5 is a cross-sectional view of the prior art specimen-holding device, taken perpendicular to the optical axis of the electron beam;

FIG. 6 is a cross-sectional view similar to FIG. 5, but taken parallel to the optical axis of the electron beam;

FIG. 8 is a cross-sectional view of the holding device shown in FIG. 7, taken along the optical axis of the electron beam; and FIG. 9 is an enlarged view of pulleys of the holding device shown in FIG. 7 and their surroundings.

DETAILED DESCRIPTION OF THE INVENTION

Figure 1:
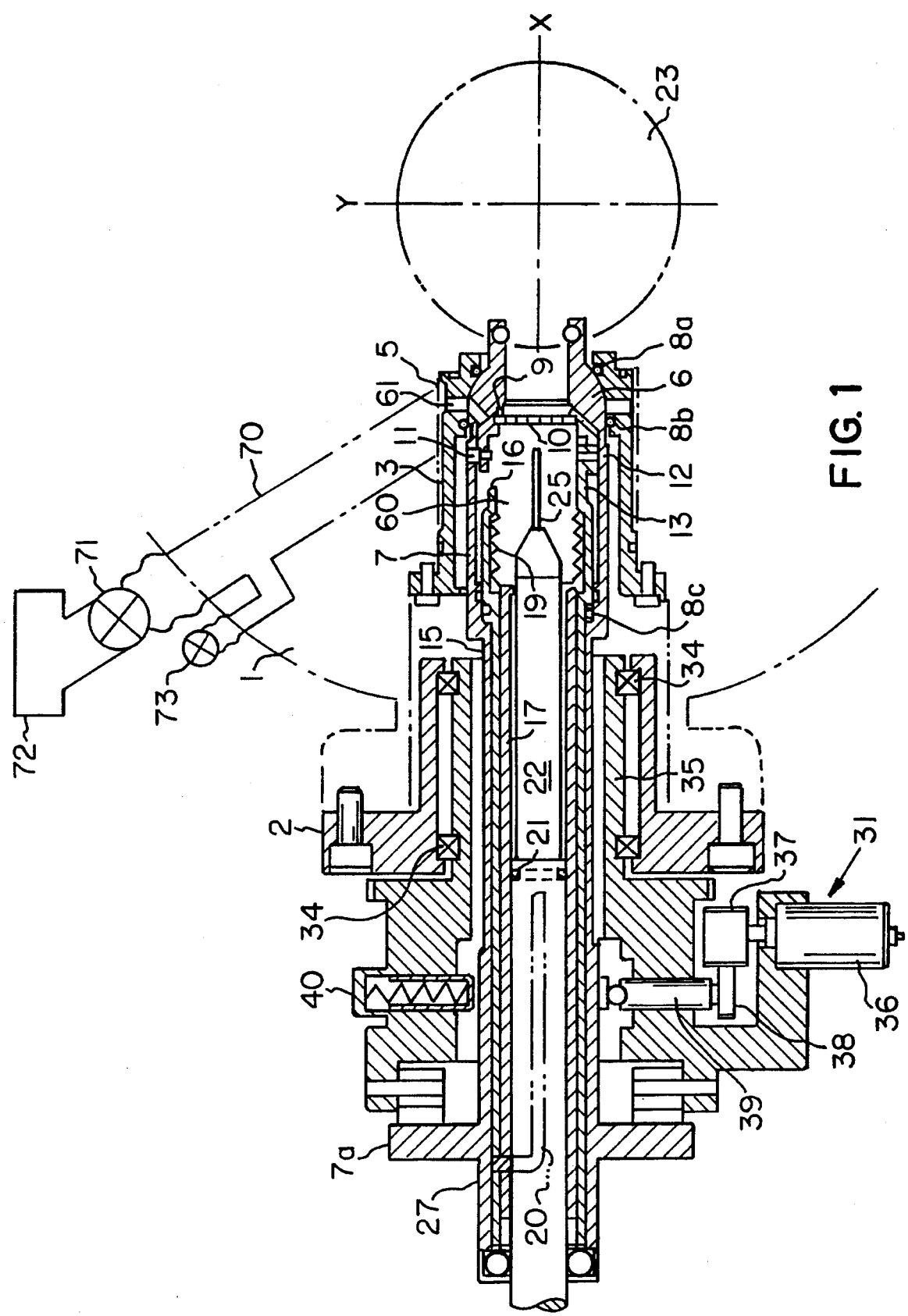
FIG. 1 is a cross-sectional view of a specimen-holding device for use with an electron microscope, taken perpendicular to the optical axis of the electron beam, the holding device being built according to the present invention.
Figure 2:
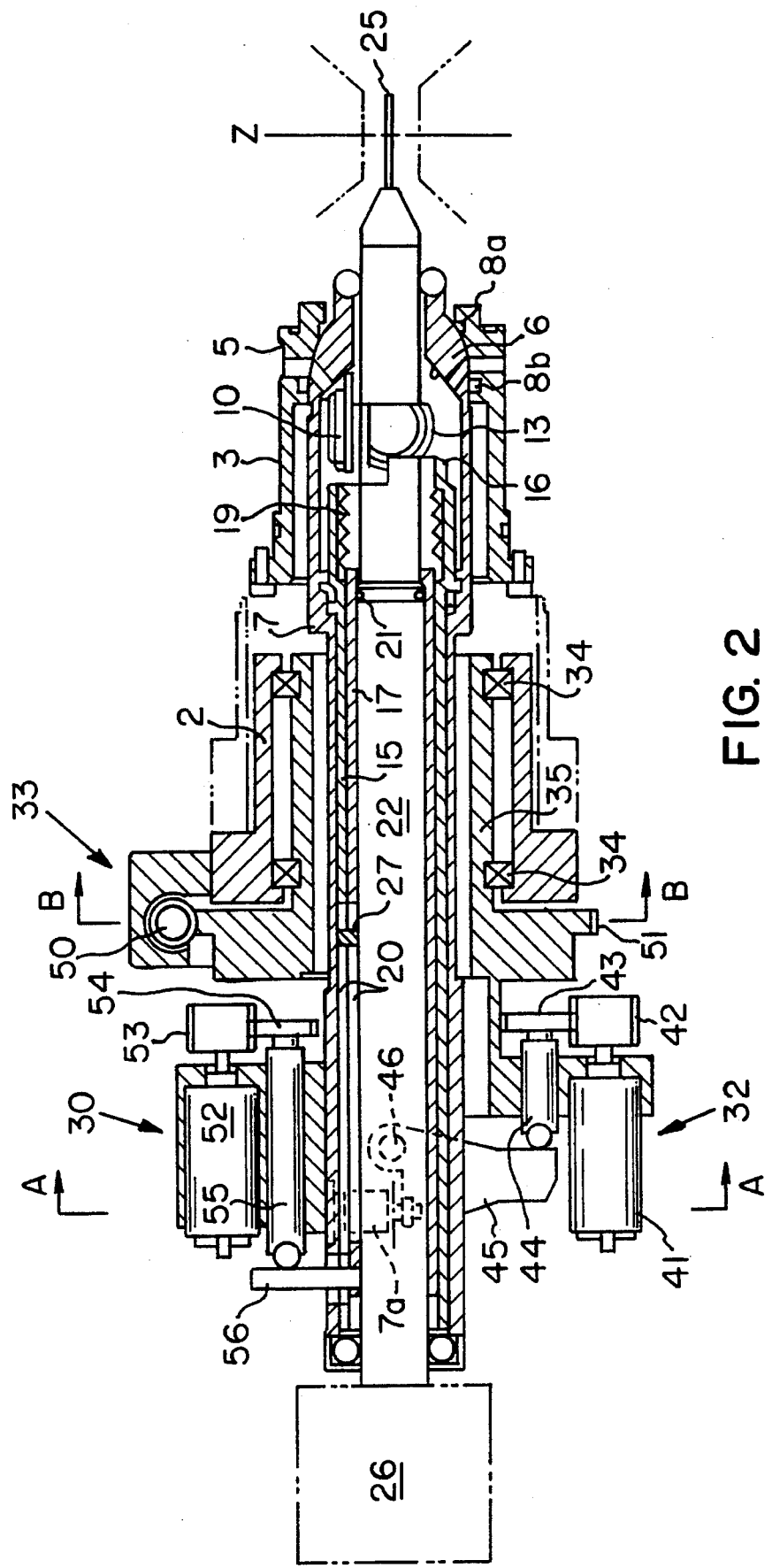
FIG. 2 is a cross-sectional view similar to FIG. 1, but taken parallel to the optical axis of the electron beam.

Referring to FIGS. 1 and 2, an ultra-high resolution transmission electron microscope (TEM) includes a specimen chamber defined by a wall 1. Cylindrical support members 2 and 3 are mounted on the wall 1. A spherical bearing 5 is formed on the inner surface of the front end of the support member 3 which extends through the wall 1 of the specimen chamber. A first pipe 7 having a spherical swelling portion 6 at its front end is inserted inside the support member 3. This swelling portion 6 of the pipe 7 is held by the spherical bearing 5 so as to be capable of swinging. The swelling portion 6 is hermetically sealed by O-rings 8a and 8b.

The spherical swelling portion 6 is provided with an opening in which an O-ring 9 is fitted. An isolation valve 10 is mounted in the first pipe 7 via the O-ring 9. One end of this isolation valve 10 is rotatably held to a pin 11, which is in turn securely mounted to the first pipe 7. The other end of the isolation valve 10 is firmly mounted to a bevel gear 13 that is rotatably held to a pin 12 affixed to the first pipe 7.

A second pipe 15 is rotatably mounted inside the first pipe 7 and hermetically sealed by an O-ring 8c. A gear 16 meshing with the bevel gear 13 is formed at the front end of the second pipe 15. A third pipe 17 is slidably mounted inside the second pipe 15. Bellows 19 are mounted between the front end of the second pipe 15 and the front end of the third pipe 17. Slits 20 are formed behind the second pipe 15 and behind the third pipe 17, respectively.

A specimen-holding rod 22 is slidably mounted inside the third pipe 17 via an O-ring 21. A specimen holder 25, which faces into the specimen chamber 23, is connected to the front end of the specimen-holding rod 22. The holder 25 has an operation portion 26 (see FIG. 2) connected to the rear end of the rod 22. A pin 27 is mounted to an intermediate portion of the rod 22. The pin 27 is capable of being engaged in the slits 20.

The specimen holder 25 is inserted into the specimen chamber 23 in the manner described now. At first, the pin 27 on the specimen-holding rod 22 is in the position shown in FIG. 1, and the specimen holder 25 is located inside a specimen exchange chamber 60. At this time, the isolation valve 10 is closed. The specimen exchange chamber 60 is hermetically isolated from the atmosphere by the O-rings 8c, 21 and by the bellows 19. Under this condition, the inside of the specimen exchange chamber 60 is evacuated through an exhaust hole 61. The wall 1 of the specimen chamber is provided with an exhaust hole 70 which is in communication with the exhaust hole 61. The exhaust hole 70 is connected with a vacuum pump 72 via an exhaust valve 71. When the inside of the specimen exchange chamber 60 is evacuated, the exhaust valve 71 is opened. When leakage from inside the specimen exchange chamber 60 is done, the exhaust valve 71 is closed, and a leakage valve 73 communicating with the exhaust hole 70 is opened.

When pumpdown of the inside of the specimen exchange chamber 60 is completed and the operation portion 26 is rotated, the second pipe 15 and the third pipe 17 rotate simultaneously, because the pin 27 on the specimen-holding rod 22 is engaged in the slits 20. This rotates the bevel gear 13 in mesh with the gear 16 which is formed at the front end of the second pipe 15. As a result, the isolation valve 10 is opened, as shown in FIG. 2. Under this condition, the specimen-holding rod 22 is inserted into the third pipe. At this time, the pin 27 is moved along the slits 20. The specimen holder 25 is moved into the specimen chamber 23. In this state, the specimen chamber 23 is hermetically isolated from the atmosphere by the bellows 19 and by the O-rings 8a, 8b, 8c, 21.

An x-motion drive means 30, a y-motion drive means 31, a z-motion drive means 32, and a tilting means 33 for tilt about the x-axis are mounted around the first pipe 7. The tilting means 33 is installed on a support member 2. The y-motion drive means 31 and the z-motion drive means 32 are located on a support member 35 which is rotatably held to the inner surface of the support member 2 via a bearing 34. The x-motion drive means 30 is located on the first pipe 7, as shown in FIG. 2.

The y-motion drive means 31 comprises a y-motion driving motor 36 which rotates gears 37 and 38, thus moving a slider 39 in the y direction, as shown in FIG. 1. As a result, the first pipe 7 is moved in the y direction against the action of a spring 40.

Figure 3:
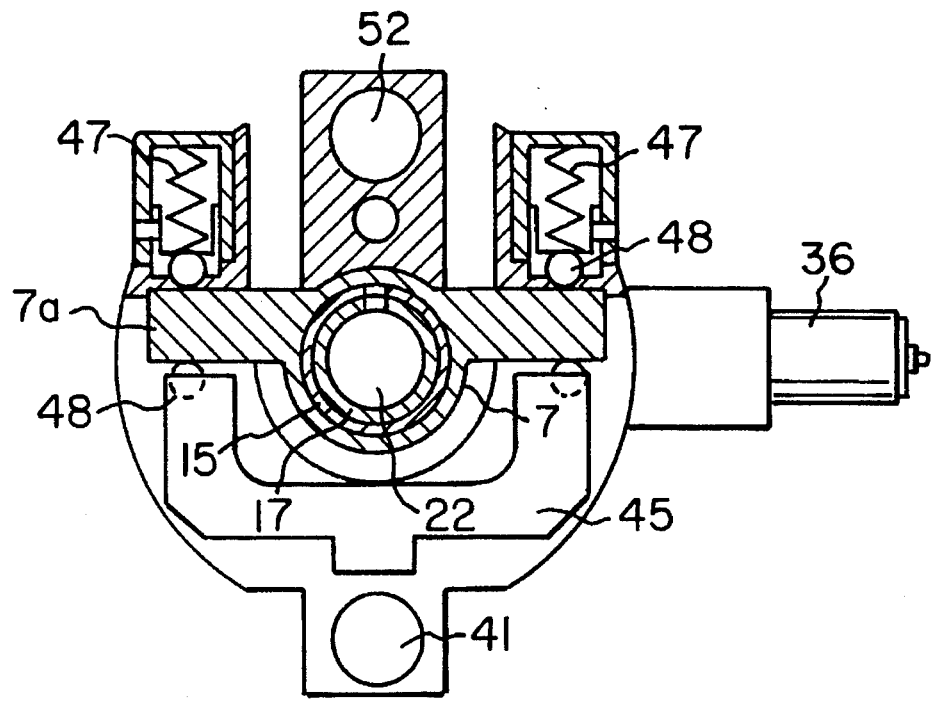
FIG. 3 is a cross-sectional view taken along the line A—A of FIG. 2.

As shown in FIGS. 2 and 3, the z-motion drive means 32 comprises a z-motion driving motor 41 which rotates gears 42 and 43, thus moving a slider 44 in the x direction. Also, a driving lever 45 is rotated about a pivot 46. Furthermore, flanges 7a formed on both sides of the first pipe 7 are shifted in the z direction against the force of a spring 47. Indicated by 48 is a roller.

Figure 4:
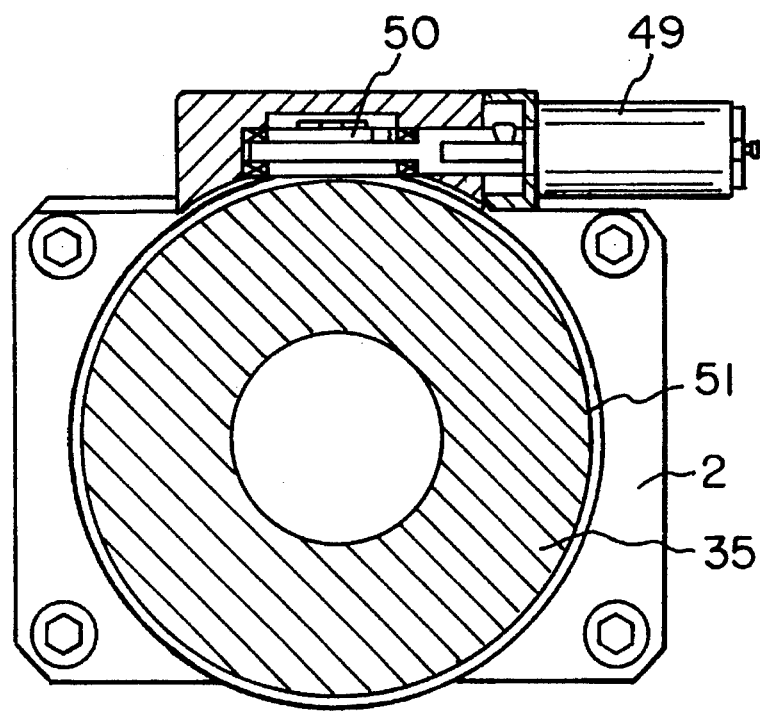
FIG. 4 is a cross-sectional view taken along the line B—B of FIG. 2.

As shown in FIGS. 2 and 4, the tilting means 33 for tilt about the x-axis comprises an x-axis tilting motor 49 which rotates a worm gear 50. As a result, a tilting gear 51 formed on the outer periphery of the support member 35 is rotated. The support member 35 and the first pipe 7 are titled about the x-axis.

The specimen-holding rod 22 is moved in the x direction in the manner described below. As shown in FIG. 2, the x-motion drive means 30 comprises an x-motion driving motor 52 which rotates gears 53 and 54. If a slider 55 is moved to the left as viewed in FIG. 2, a shaft 56 firmly mounted to the third pipe 17 is moved to the left. Also, the third pipe 17 and the specimen-holding rod 22 are moved to the left along the x-axis. If the x-motion driving motor 52 is rotated in the opposite direction, the pressure difference between the vacuum inside the specimen chamber 23 and the outside atmosphere moves the third pipe 17 and the specimen-holding rod 22 towards the specimen chamber 23.

Therefore, when the specimen-holding rod 22 moves in the x direction, the third pipe 17 is moved while the hermetic seal is maintained by elongation and contraction of the bellows. At this time, the O-ring 21 between the third pipe 17 and the rod 22 is kept at rest. Consequently, the rod 22 can be smoothly moved in the x direction in a short time.

Figure 7:
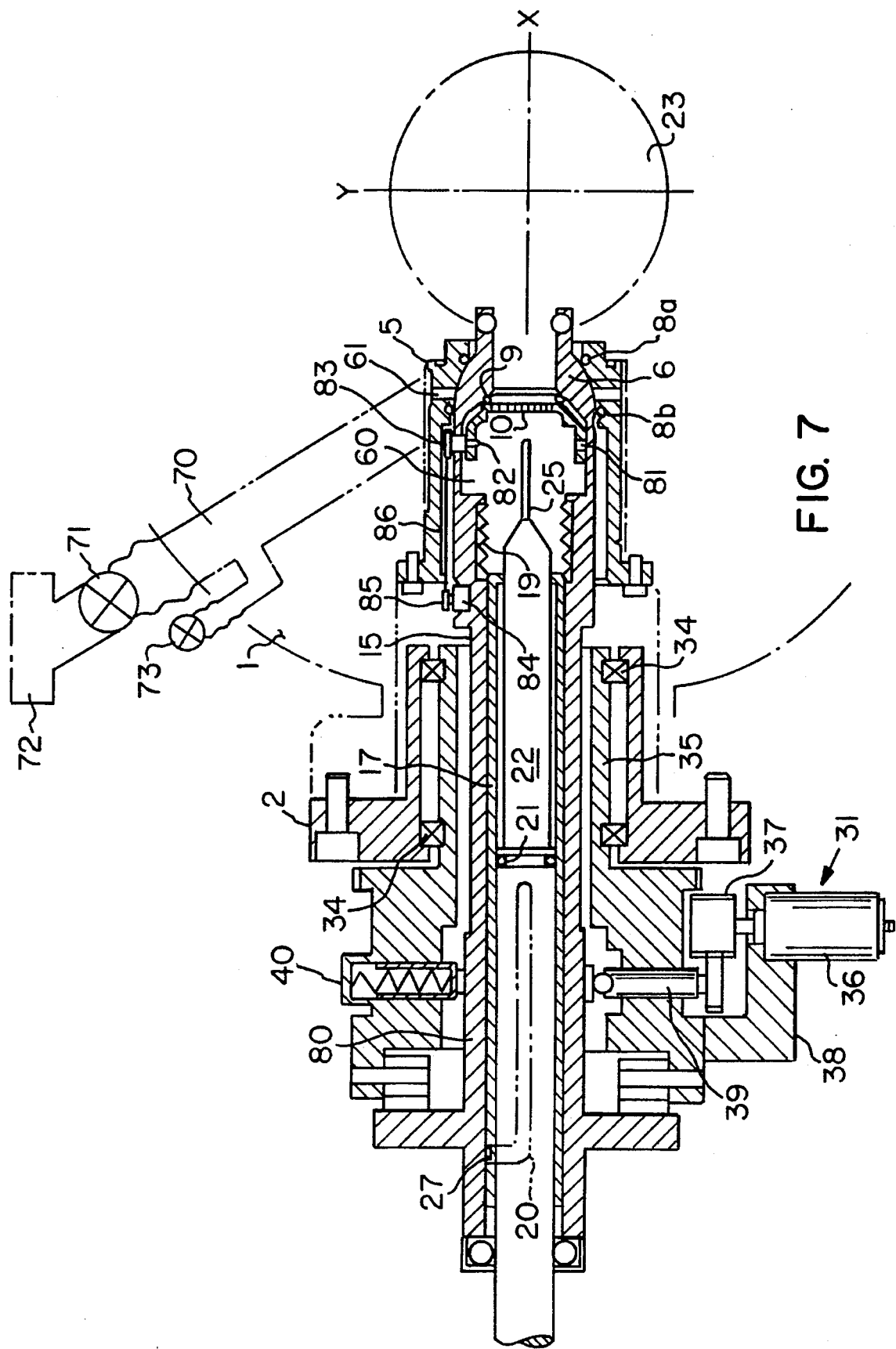
FIG. 7 is a cross-sectional view of another specimen-holding device for use with an electron microscope, taken perpendicular to the optical axis of the electron beam, the holding device being built according to the present invention.

In the above example, the isolation valve is opened and closed by rotating the second pipe. The isolation valve may be opened and closed by another configuration which is shown in FIGS. 7 and 8. It is to be noted that like components are indicated by like reference numerals in various figures.

Referring to FIGS. 7 and 8, an inner pipe 17 is slidably mounted inside an outer pipe 80. Bellows 19 are mounted between the front end of the outer pipe 80 and the front end of the inner pipe 17. One end of the isolation valve 10 is rotatably held to a pin 81 which is affixedly mounted to the outer pipe 80, while the other end of the valve 10 is firmly secured to a rotating pin 82 securely mounted to the outer pipe 80. An O-ring 87 forming a vacuum seal is disposed between the rotating pin 82 and the outer pipe 80. A pulley 83 is mounted to the rotating pin 82. Another pulley 85 and an actuator 84 for rotating the pulley 85 are mounted on the outer surface of the outer pipe 80. A wire 86 is stretched between the pulleys 83 and 85. FIG. 9 is an enlarged view of the pulleys shown in FIG. 7 and their surroundings.

In this structure, when an external driving signal is supplied to the rotating actuator 84, it rotates together with the pulley 85 fixed to the actuator 84. The rotation of the pulley 85 rotates the pulley 83 via the wire 86, thus rotating the pin 82. In consequence, the isolation valve 10 is rotated, so that the valve 10 is opened and closed. In this example, the rotating actuator is provided instead of the second pipe shown in FIGS. 1 and 2 to open and close the isolation valve. Hence, the structure is simpler than the structure of the example described first.

Having thus described my invention with the detail and particularity required by the Patent Laws, what is desired protected by Letters Patent is set forth in the following claims.

What is claimed is:

1. A specimen-holding device for use with an electron microscope having a specimen chamber, said specimen-holding device comprising:

a cylindrical support member inserted into said specimen chamber;

a spherical bearing formed on an inner surface of a front end of said support member;

a first pipe capable of being swung about said spherical bearing by at least a y-motion drive means and a z-motion drive means;

a second pipe rotatably mounted inside said first pipe;

a third pipe mounted inside said second pipe and capable of being slid by an x-motion drive means;

a specimen-holding rod slidably mounted in said third pipe via an O-ring;

bellows mounted between said second pipe and said third pipe;

an isolation valve disposed within said first pipe to seal the interior of said first pipe from said specimen chamber; and means for opening and closing said isolation valve driven by rotation of said second pipe.

2. The specimen-holding device of claim 1, wherein said means for opening and closing said isolation valve comprises a bevel gear mounted to a shaft and a second gear formed at a front end of said second pipe and engaging with said bevel gear, said isolation valve being rotatably held to said shaft which is journaled in said first pipe, and wherein rotation of said second pipe rotates said bevel gear and said second gear, thus opening and closing said valve.

3. A specimen-holding device for use with an electron microscope having a specimen chamber, said specimen-holding device comprising:

a cylindrical support member inserted into said specimen chamber;

a spherical bearing formed on an inner surface of a front end of said support member;

an outer pipe capable of being swung about said spherical bearing by at least a y-motion drive means and a z-motion drive means;

an inner pipe mounted inside said outer pipe and capable of being slid by an x-motion drive means;

a specimen-holding rod slidably mounted in said inner pipe via an O-ring;

bellows mounted between said outer pipe and said inner pipe;

an isolation valve disposed within said outer pipe to seal the interior of said outer pipe from said specimen chamber; and means for opening and closing said isolation valve.

4. The specimen-holding device of claim 3, wherein said means for opening and closing said isolation valve comprises a rotating body mounted to a first shaft, a driving shaft for rotating said rotating body, and a driving force-transmitting means for coupling together said driving shaft and said rotating body, said isolation valve being rotatably held to said first shaft, and wherein rotation of said driving shaft rotates said rotating body and said isolation valve, thus opening and closing said valve.

* * * * *